United States Patent
Liu et al.

(10) Patent No.: US 11,955,536 B2
(45) Date of Patent: Apr. 9, 2024

(54) SEMICONDUCTOR TRANSISTOR STRUCTURE AND FABRICATION METHOD THEREOF

(71) Applicant: United Semiconductor (Xiamen) Co., Ltd., Fujian (CN)

(72) Inventors: Sheng-Hsu Liu, Changhua County (TW); Shih-Hsien Huang, Kaohsiung (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 241 days.

(21) Appl. No.: 17/377,319

(22) Filed: Jul. 15, 2021

(65) Prior Publication Data
US 2022/0399459 A1 Dec. 15, 2022

(30) Foreign Application Priority Data
Jun. 11, 2021 (CN) .......................... 202110651874.3

(51) Int. Cl.
*H01L 29/66* (2006.01)
*H01L 21/8234* (2006.01)
*H01L 29/78* (2006.01)

(52) U.S. Cl.
CPC .............. *H01L 29/66795* (2013.01); *H01L 21/823431* (2013.01); *H01L 29/7848* (2013.01); *H01L 29/7851* (2013.01)

(58) Field of Classification Search
CPC ............. H01L 29/66795; H01L 29/785; H01L 29/105; H01L 29/66681; H01L 21/823431
See application file for complete search history.

(56) References Cited

U.S. PATENT DOCUMENTS

| | | | |
|---|---|---|---|
| 8,373,208 B2 * | 2/2013 | Bobde | H01L 29/7817 257/256 |
| 9,461,110 B1 | 10/2016 | Wang | |
| 10,141,430 B1 | 11/2018 | Fung | |
| 2002/0011617 A1 * | 1/2002 | Kubo | H01L 27/092 257/E29.05 |
| 2003/0034529 A1 * | 2/2003 | Fitzgerald | H01L 21/823807 257/369 |
| 2005/0184316 A1 * | 8/2005 | Kim | H01L 29/66795 257/213 |
| 2006/0076625 A1 | 4/2006 | Lee | |
| 2010/0219396 A1 * | 9/2010 | Jin | H01L 29/161 257/E29.069 |
| 2011/0169101 A1 * | 7/2011 | Doornbos | H01L 29/7856 257/E21.409 |

(Continued)

FOREIGN PATENT DOCUMENTS

| | | |
|---|---|---|
| CN | 106531793 A | 3/2017 |
| CN | 106571340 A | 4/2017 |

(Continued)

*Primary Examiner* — Tuan A Hoang
(74) *Attorney, Agent, or Firm* — Winston Hsu

(57) ABSTRACT

A semiconductor transistor structure includes a substrate with a first conductivity type, a fin structure grown on the substrate, and a gate on the fin structure. The fin structure includes a first epitaxial layer having a second conductivity type opposite to the first conductivity type, a second epitaxial layer on the first epitaxial layer, and a third epitaxial layer having the second conductivity type on the second epitaxial layer.

6 Claims, 4 Drawing Sheets

(56) References Cited

U.S. PATENT DOCUMENTS

| | | | |
|---|---|---|---|
| 2012/0256238 A1* | 10/2012 | Ning | H01L 29/66893 |
| | | | 257/256 |
| 2015/0001591 A1 | 1/2015 | Akarvardar | |
| 2015/0144877 A1* | 5/2015 | Mears | H01L 29/66537 |
| | | | 438/283 |
| 2015/0255457 A1 | 9/2015 | Loubet | |
| 2016/0233319 A1 | 8/2016 | Lu | |
| 2016/0322358 A1 | 11/2016 | Ching | |
| 2017/0141112 A1 | 5/2017 | Ching | |
| 2018/0108732 A1 | 4/2018 | Shu | |
| 2019/0067418 A1 | 2/2019 | Yang | |
| 2020/0044084 A1 | 2/2020 | Yeh | |
| 2020/0105617 A1 | 4/2020 | Wang | |
| 2020/0203340 A1 | 6/2020 | Bae | |
| 2021/0098631 A1 | 4/2021 | Fung | |
| 2021/0098634 A1 | 4/2021 | Chung | |

FOREIGN PATENT DOCUMENTS

| | | |
|---|---|---|
| CN | 106611787 A | 5/2017 |
| CN | 106960846 A | 7/2017 |
| CN | 107623033 A | 1/2018 |
| CN | 108122976 A | 6/2018 |
| CN | 109103108 A | 12/2018 |
| CN | 109427588 A | 3/2019 |
| CN | 110783192 A | 2/2020 |
| CN | 111162044 A | 5/2020 |
| CN | 112242434 A | 1/2021 |
| JP | 2006-93717 A | 4/2006 |
| KR | 10-2021-0010801 A | 1/2021 |

\* cited by examiner

SEMICONDUCTOR TRANSISTOR STRUCTURE AND FABRICATION METHOD THEREOF

BACKGROUND OF THE INVENTION

1. Field of the Invention

The present invention relates to the field of semiconductor technology, in particular to an improved semiconductor transistor structure.

2. Description of the Prior Art

Fin field effect transistors (finfets) are fabricated with thin "fins" (or fin structures) extending from the substrate. A channel of the FET is formed in the fin. A gate (or gate structure) is disposed over the fin. The gate controls the channel in the fin.

As the dimensions of the integrated circuits shrink, the leakage could not be well controlled due to transistors with higher driving currents.

SUMMARY OF THE INVENTION

One object of the present invention is to provide an improved semiconductor transistor structure to solve the above-mentioned deficiencies or shortcomings of the prior art.

One aspect of the invention provides a semiconductor transistor structure including a substrate with a first conductivity type, a fin structure grown on the substrate, the fin structure comprising a first epitaxial layer having a second conductivity type opposite to the first conductivity type, a second epitaxial layer on the first epitaxial layer, and a third epitaxial layer having the second conductivity type on the second epitaxial layer, and a gate on the fin structure.

According to some embodiments, the first conductivity type is P type and the second conductivity type is N type.

According to some embodiments, the first epitaxial layer and the third epitaxial layer having the second conductivity type comprise a SiGe layer doped with phosphorus or arsenic.

According to some embodiments, a concentration of the phosphorus or arsenic is between 1E18-1E19 atoms/cm$^3$.

According to some embodiments, a thickness of the SiGe layer is between 1-20 nm.

According to some embodiments, the second epitaxial layer is an intrinsic SiGe layer.

According to some embodiments, the second epitaxial layer is a P-type doped SiGe layer.

According to some embodiments, the fin structure has a width of about 3-100 nm.

According to some embodiments, the semiconductor transistor structure further comprises a gate dielectric layer between the gate and the fin structure.

According to some embodiments, the semiconductor transistor structure further comprises a buffer layer disposed at a bottom of the fin structure; and a strain relaxed layer on the buffer layer.

Another aspect of the invention provides a method of forming a semiconductor transistor structure. A substrate with a first conductivity type is provided. A fin structure is grown on the substrate. The fin structure includes a first epitaxial layer having a second conductivity type opposite to the first conductivity type, a second epitaxial layer on the first epitaxial layer, and a third epitaxial layer having the second conductivity type on the second epitaxial layer. A gate is formed on the fin structure.

According to some embodiments, the first conductivity type is P type and the second conductivity type is N type.

According to some embodiments, the first epitaxial layer and the third epitaxial layer having the second conductivity type comprise a SiGe layer doped with phosphorus or arsenic.

According to some embodiments, a concentration of the phosphorus or arsenic is between 1E18-1E19 atoms/cm$^3$.

According to some embodiments, a thickness of the SiGe layer is between 1-20 nm.

According to some embodiments, the second epitaxial layer is an intrinsic SiGe layer.

According to some embodiments, the second epitaxial layer is a P-type doped SiGe layer.

According to some embodiments, the fin structure has a width of about 3-100 nm.

According to some embodiments, a gate dielectric layer is formed between the gate and the fin structure.

According to some embodiments, a buffer layer is formed at a bottom of the fin structure, and a strain relaxed layer is formed on the buffer layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
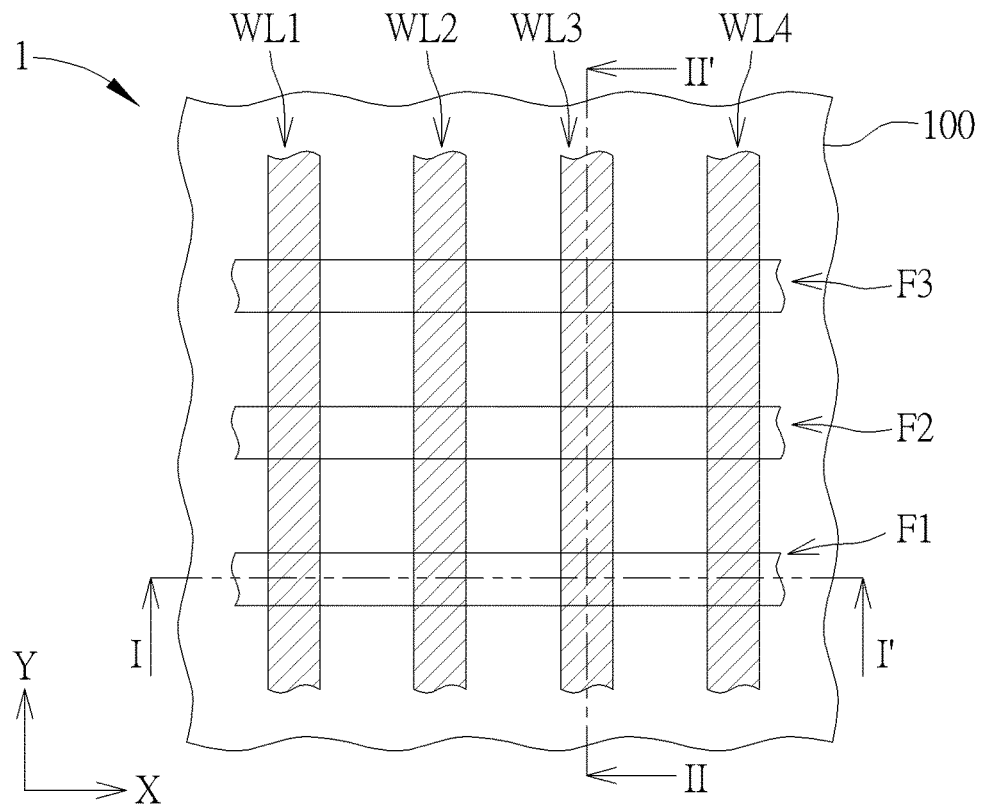
FIG. 1 illustrates a schematic top view of a semiconductor transistor structure.
Figure 2:
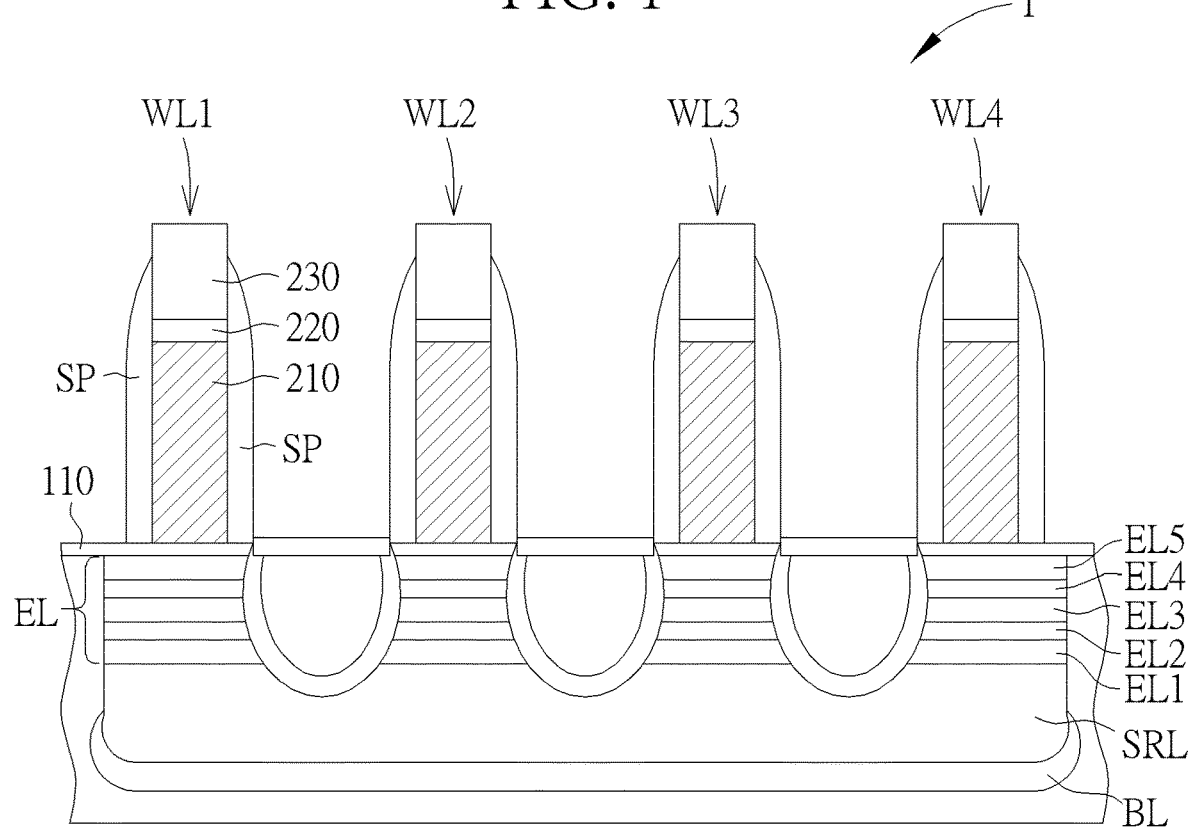
FIG. 2 is a schematic cross-sectional view taken along the line I-I' in FIG. 1.
Figure 3:
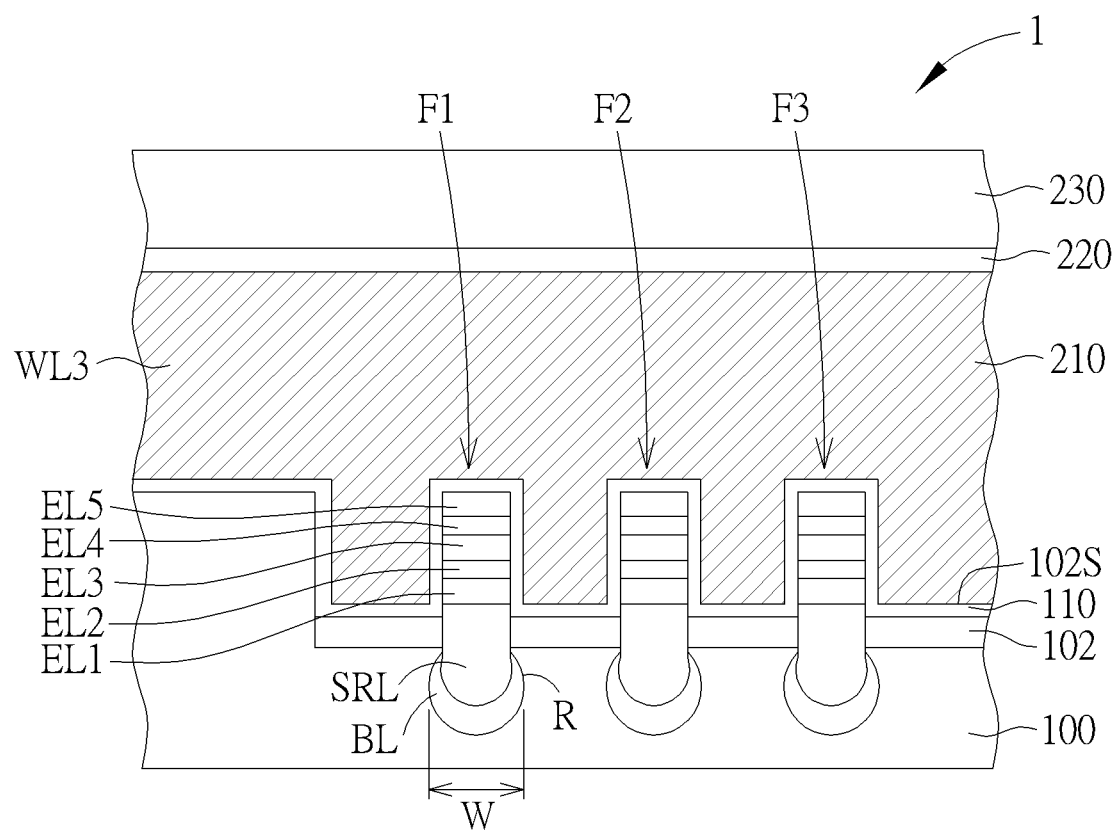
FIG. 3 is a schematic cross-sectional view taken along the line II-IF in FIG. 1.

Please refer to FIG. 1 to FIG. 3. FIG. 1 illustrates a schematic top view of a semiconductor transistor structure. FIG. 2 is a schematic cross-sectional view taken along the line I-I' in FIG. 1. FIG. 3 is a schematic cross-sectional view taken along the line II-IF in FIG. 1. As shown in FIG. 1 to FIG. 3, a semiconductor transistor structure 1 of the present invention, for example, a PMOS transistor includes a substrate 100 having a first conductivity type, for example, P-type, and the substrate 100 may be a P-type silicon substrate. Three exemplary fin structures F1 to F3 extending along the reference x-axis direction are disposed on the substrate 100 and grown on the substrate 100 in an epitaxial manner.

According to an embodiment of the present invention, the substrate 100 is further provided with a trench isolation structure 102. The fin structures F1 to F3 protrude from the top surface 102s of the trench isolation structure 102. According to an embodiment of the present invention, the width w of each of the fin structures F1 to F3 is about 3 nm to 100 nm, but is not limited thereto.

According to an embodiment of the present invention, each of the fin structures F1 to F3 includes an epitaxial layer EL having alternately stacked layers. According to an embodiment of the present invention, the epitaxial layer EL may include at least a first epitaxial layer EL1 having a second conductivity type opposite to the first conductivity type, and a second epitaxial layer EL2 on the first epitaxial layer EL1, and a third epitaxial layer EL3 of the second conductivity type on the second epitaxial layer EL2. According to an embodiment of the present invention, for example, the first conductivity type is P type and the second conductivity type is N type.

Of course, the number of layers of the epitaxial layer EL is not limited to three layers, and may be five or seven layers in other embodiments. For example, in FIG. 2 and FIG. 3, a fourth epitaxial layer EL4 may be provided on the third epitaxial layer EL3, and a fifth epitaxial layer EL5 having the second conductivity type can be provided on the fourth epitaxial layer EL4.

According to an embodiment of the present invention, the second epitaxial layer EL2 and the fourth epitaxial layer EL4 may be intrinsic SiGe layers (or undoped SiGe layers) having a germanium concentration ranging between 20% and 100%, which can be used as a channel layer for holes. According to an embodiment of the present invention, the first epitaxial layer EL1, the third epitaxial layer EL3, and the fifth epitaxial layer EL5 having the second conductivity type include SiGe layers doped with phosphorus or arsenic, so that the alternately stacked epitaxial layer EL has n-i-n-i-n configuration, which can improve the performance of the transistor when the size of the MOS transistor element is less than 10 nm. By providing multiple channels in the epitaxial layer EL, the leakage current can be more effectively controlled, and higher drive current can be provided.

According to an embodiment of the present invention, for example, the concentration of phosphorus or arsenic in the first epitaxial layer EL1, the third epitaxial layer EL3, and the fifth epitaxial layer EL5 may be between 1E18-1E19 atoms/cm$^3$. According to an embodiment of the present invention, the thickness of each SiGe layer mentioned above may be between 1-20 nm.

According to another embodiment of the present invention, the second epitaxial layer EL2 and the fourth epitaxial layer EL4 may be P-type doped SiGe layers, so that the alternately stacked epitaxial layer EL has an n-p-n-p-n configuration.

In other embodiments of the present invention, the semiconductor transistor structure 1 may be an NMOS transistor, where the first epitaxial layer EL1, the third epitaxial layer EL3, and the fifth epitaxial layer EL5 may be boron-doped SiC layers or Si layer (the concentration of boron can be between 1E15-1E17 atoms/cm$^3$). The second epitaxial layer EL2 and the fourth epitaxial layer EL4 can be intrinsic SiC or Si layers, so that the alternately stacked epitaxial layer EL has p-i-p-i-p configuration.

Alternatively, the first epitaxial layer EL1, the third epitaxial layer EL3, and the fifth epitaxial layer EL5 may be a boron-doped SiC layer or a Si layer (the concentration of boron may be between 1E15-E17 atoms/cm$^3$). The second epitaxial layer EL2 and the fourth epitaxial layer EL4 may be N-type doped SiC or Si layers, so that the alternately stacked epitaxial layer EL has p-n-p-n-p configuration.

According to an embodiment of the present invention, the semiconductor transistor structure 1 may further include a buffer layer BL disposed at the bottom of each of the fin structures F1 to F3. According to an embodiment of the present invention, the buffer layer BL is formed in the pocket-shaped recessed region R, wherein the depth of the pocket-shaped recessed region R is about 30 nm to 100 nm, and the thickness of the buffer layer BL is about 5 nm to 35 nm.

According to an embodiment of the present invention, the pocket-shaped recessed region R and the buffer layer BL can reduce the dislocation phenomenon caused by the subsequent epitaxial growth of the epitaxial layer EL, and the grown epitaxial layer EL can have high stability in the subsequent thermal process. According to an embodiment of the present invention, the buffer layer BL may be a silicon layer doped with germanium and has a graded or step germanium concentration. For example, the germanium concentration may range from 0 to 25% (atomic percentage), but is not limited thereto.

According to an embodiment of the present invention, the semiconductor transistor structure 1 further includes a strain relaxed layer SRL on the buffer layer BL. According to an embodiment of the present invention, the strain relaxed layer SRL is interposed between the first epitaxial layer EL1 having the second conductivity type and the buffer layer BL. According to an embodiment of the present invention, the strain relaxed layer SRL may be a silicon layer doped with germanium and has a graded or step germanium concentration, wherein the germanium concentration of the strain relaxed layer SRL may exceed 25% (atomic percentage).

According to an embodiment of the present invention, as shown in FIG. 1, the semiconductor transistor structure 1 may further include gate electrodes WL1 to WL4 located on the fin structures F1 to F3. According to an embodiment of the present invention, as shown in FIG. 2 and FIG. 3, each of the gate electrodes WL1 to WL4 may include a polysilicon layer 210, a silicon nitride cap layer 220, and a silicon oxide hard mask layer 230, but not limited thereto.

According to an embodiment of the present invention, the semiconductor transistor structure 1 further includes a gate dielectric layer 110 between each of the gate electrodes WL1 to WL4 and each of the fin structures F1 to F3. According to an embodiment of the present invention, as shown in FIG. 2, the semiconductor transistor structure 1 may further include a spacer SP, which is disposed on a sidewall of each of the gate electrodes WL1 to WL4.

Figure 4:
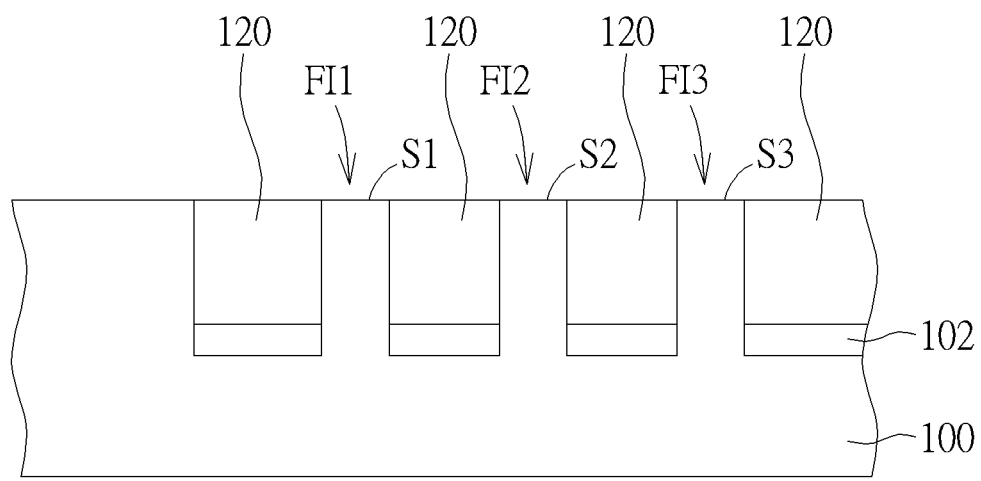
FIG. 4 to FIG. 7 are schematic diagrams showing a method of manufacturing a semiconductor transistor structure according to an embodiment of the present invention.

Please refer to FIG. 4 to FIG. 7, which are schematic diagrams showing a method of manufacturing a semiconductor transistor structure according to an embodiment of the present invention. As shown in FIG. 4, first, a substrate 100 having a first conductivity type is provided. For example, the first conductivity type may be P-type, and the substrate 100 may be a P-type silicon substrate. A plurality of fin structures FI1 to FI3 is formed on the substrate 100. The fin structures FI1 to FI3 protrude from the trench isolation structure 102 and are surrounded by the insulation layer 120. According to an embodiment of the present invention, for example, the insulation layer 120 may be a silicon oxide layer.

According to an embodiment of the present invention, the fin structures FI1 to FI3 are etched out of a part of the substrate 100. For example, the fin structures FI1 to FI3 may only include silicon. Through the chemical mechanical polishing process, the insulation layer 120 can be planarized, so that the top surfaces S1 to S3 of the fin structures FI1 to FI3 are respectively exposed.

Figure 5:
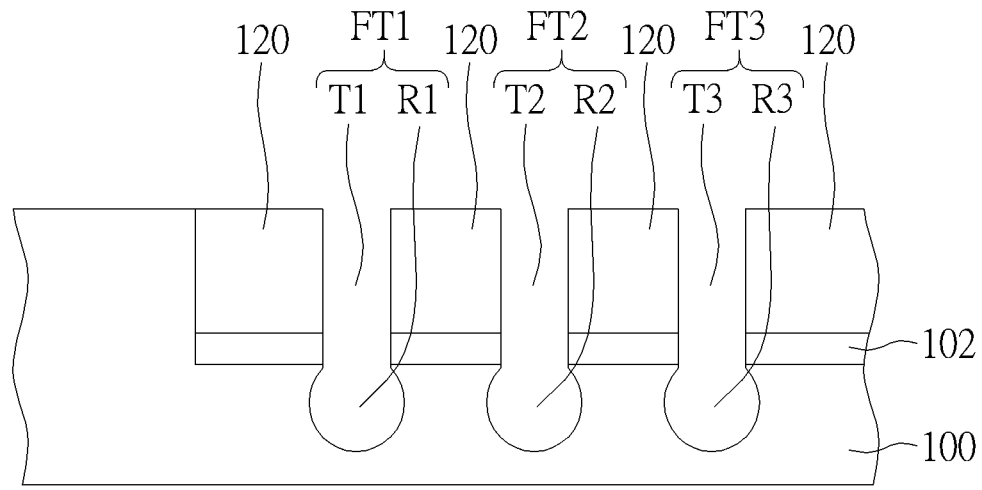

As shown in FIG. 5, an etching process is then performed to remove the fin structures FI1 to FI3, thereby forming trenches T1 to T3 in the insulation layer 120. The etching process is continued to etch the substrate 100 so as to form pocket-shaped recessed regions R1 to R3 in the substrate 100. The trenches T1 to T3 and the pocket-shaped recessed regions R1 to R3 constitute fin trench structures FT1 to FT3, respectively.

Figure 6:
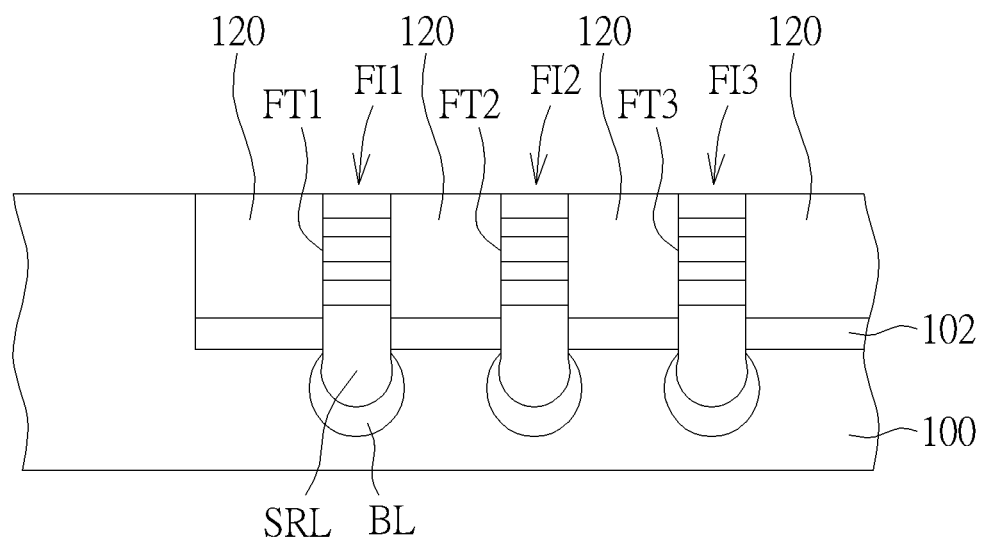

As shown in FIG. 6, an epitaxial process is then performed. According to an embodiment of the present invention, a buffer layer BL may be formed at the bottom of the fin trench structures FT1 to FT3. According to an embodiment of the present invention, the buffer layer BL is formed in the pocket-shaped recessed region R, wherein the depth of the pocket-shaped recessed region R is about 30 nm to 100 nm, and the thickness of the buffer layer BL is about 5 nm to 35 nm.

According to an embodiment of the present invention, the pocket-shaped recessed region R and the buffer layer BL can reduce the dislocation phenomenon caused by the subsequent epitaxial growth of the epitaxial layer EL, and the grown epitaxial layer EL can have a high stability in the subsequent thermal process. According to an embodiment of the present invention, the buffer layer BL may be a silicon layer doped with germanium and has a graded or step germanium concentration. For example, the germanium concentration may range from 0 to 25% (atomic percentage), but is not limited thereto.

According to an embodiment of the present invention, the strain relaxed layer SRL can then be formed on the buffer layer BL. According to an embodiment of the present invention, the strain relaxed layer SRL may be a silicon layer doped with germanium and has a graded or step germanium concentration, wherein the germanium concentration of the strain relaxed layer SRL may exceed 25% (atomic percentage).

According to an embodiment of the present invention, fin structures F1 to F3 are then grown on the strain relaxed layer SRL through the fin trench structures FT1 to FT3. According to an embodiment of the present invention, each of the fin structure F1 to F3 includes an epitaxial layer EL having alternately stacked layers. According to an embodiment of the present invention, the epitaxial layer EL may include at least a first epitaxial layer EL1 having a second conductivity type opposite to the first conductivity type, a second epitaxial layer EL2 on the first epitaxial layer EL1, and a third epitaxial layer EL3 of the second conductivity type on the second epitaxial layer EL2. According to an embodiment of the present invention, for example, the first conductivity type is P type, and the second conductivity type is N type.

Of course, the number of layers of the epitaxial layer EL is not limited to three layers, and may be five or seven layers in other embodiments. For example, in FIG. 2 and FIG. 3, a fourth epitaxial layer EL4 can be provided on the third epitaxial layer EL3, and a fifth epitaxial layer EL5 having the second conductivity type can be provided on the fourth epitaxial layer EL4.

According to an embodiment of the present invention, the second epitaxial layer EL2 and the fourth epitaxial layer EL4 may be intrinsic SiGe layers (or undoped SiGe layers), where the germanium concentration may be between 20% and 100%, which can be used as a channel layer for holes.

According to an embodiment of the present invention, the first epitaxial layer EL1, the third epitaxial layer EL3, and the fifth epitaxial layer EL5 having the second conductivity type include SiGe layers doped with phosphorus or arsenic, so that the alternately stacked epitaxial layer EL has n-i-n-i-n configuration, which can improve the performance of the transistor when the size of the MOS transistor element is less than 10 nm. By providing multiple channels in the epitaxial layer EL, the leakage current can be more effectively controlled, and higher drive current can be provided.

According to an embodiment of the present invention, for example, the concentration of phosphorus or arsenic in the first epitaxial layer EL1, the third epitaxial layer EL3, and the fifth epitaxial layer EL5 may be between 1E18-1E19 atoms/cm$^3$. According to an embodiment of the present invention, the thickness of each SiGe layer mentioned above is between 1-20 nm.

According to another embodiment of the present invention, the second epitaxial layer EL2 and the fourth epitaxial layer EL4 may be P-type doped SiGe layers, so that the alternately stacked epitaxial layer EL has n-p-n-p-n configuration.

In other embodiments of the present invention, the semiconductor transistor structure 1 may be an NMOS transistor, where the first epitaxial layer EL1, the third epitaxial layer EL3, and the fifth epitaxial layer EL5 may be boron-doped SiC layers or Si layer (the concentration of boron can be between 1E15-1E17 atoms/cm$^3$), the second epitaxial layer EL2 and the fourth epitaxial layer EL4 can be intrinsic SiC or Si layers, so that the alternately stacked epitaxial layer EL has p-i-p-i-p configuration.

Alternatively, the first epitaxial layer EL1, the third epitaxial layer EL3, and the fifth epitaxial layer EL5 may be a boron-doped SiC layer or a Si layer (the concentration of boron may be between 1E15-1E17 atoms/cm$^3$). The second epitaxial layer EL2 and the fourth epitaxial layer EL4 may be N-type doped SiC or Si layers, so that the alternately stacked epitaxial layer EL has p-n-p-n-p configuration.

Figure 7:
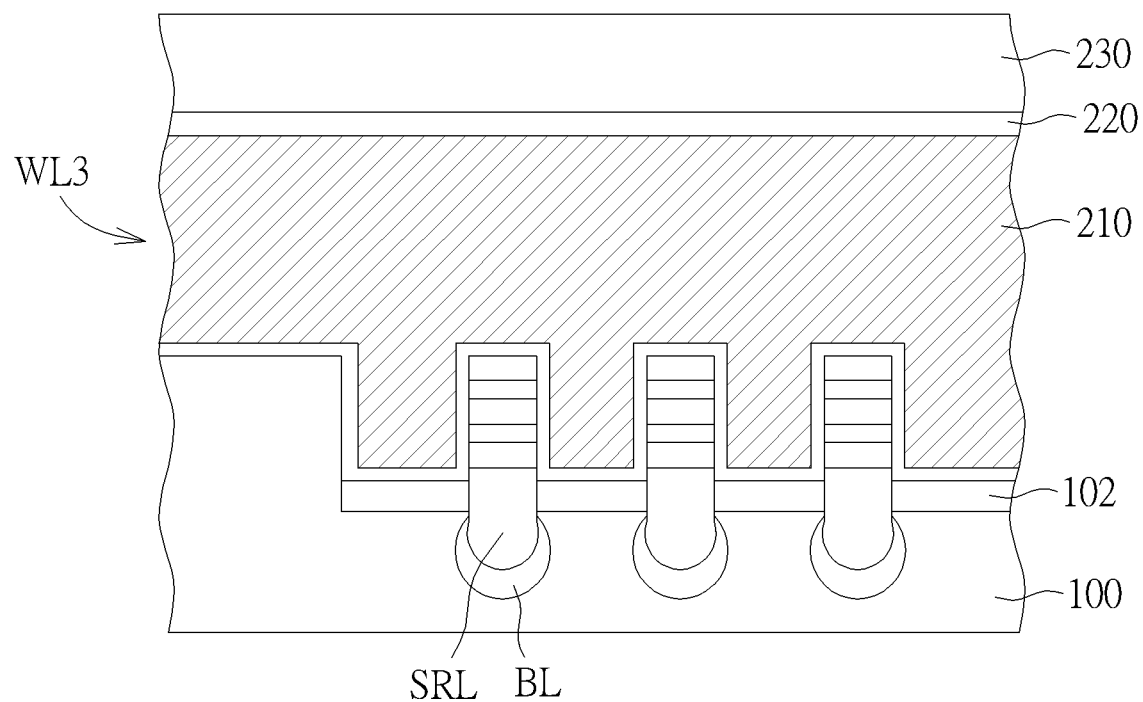

As shown in FIG. 7, the insulation layer 120 can then be removed to expose the fin structures F1 to F3. A gate WL3 is then formed on the fin structures F1 to F3. According to an embodiment of the present invention, each of the gates WL1 to WL3 may include a polysilicon layer 210, a silicon nitride cap layer 220, and a silicon oxide hard mask layer 230, but not limited thereto. According to an embodiment of the present invention, a gate dielectric layer 110, for example, a silicon oxide layer may be formed between the gate WL3 and the fin structures F1 to F3.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor transistor structure, comprising:
  providing a substrate with a first conductivity type;
  growing a fin structure on the substrate, the fin structure comprising an epitaxial stack disposed at an uppermost portion of the fin, the epitaxial stack comprising a first epitaxial SiGe layer having a second conductivity type opposite to the first conductivity type, a second epitaxial SiGe layer on the first epitaxial SiGe layer and in direct contact with the first epitaxial layer, and a third epitaxial SiGe layer having the second conductivity type on the second epitaxial SiGe layer and in direct contact with the second epitaxial SiGe layer, wherein the first epitaxial SiGe layer and the third epitaxial SiGe layer having the second conductivity type comprise a SiGe layer doped with phosphorus or arsenic, wherein the second epitaxial SiGe layer is an intrinsic SiGe layer;

forming a gate on the fin structure;

forming a buffer layer at a bottom of the fin structure; and forming a strain relaxed layer on the buffer layer.

2. The method according to claim 1, wherein the first conductivity type is P type and the second conductivity type is N type.

3. The method according to claim 1, wherein a concentration of the phosphorus or arsenic is between 1E18-1E19 atoms/cm$^3$.

4. The method according to claim 1, wherein a thickness of the SiGe layer is between 1-20 nm.

5. The method according to claim 1, wherein the fin structure has a width of about 3-100 nm.

6. The method according to claim 1 further comprising:

forming a gate dielectric layer between the gate and the fin structure.

* * * * *